United States Patent
Yan et al.

(10) Patent No.: US 10,068,996 B2
(45) Date of Patent: Sep. 4, 2018

(54) ARRAY SUBSTRATE, FABRICATION METHOD, AND DISPLAY PANEL

(71) Applicant: Shanghai Tianma AM-OLED Co., Ltd., Shanghai (CN)

(72) Inventors: Guowen Yan, Shanghai (CN); Qiang Fei, Shanghai (CN); Weiqi Xu, Shanghai (CN); Zhengkui Dong, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/708,829

(22) Filed: Sep. 19, 2017

(65) Prior Publication Data

US 2018/0006142 A1    Jan. 4, 2018

(30) Foreign Application Priority Data

Jun. 30, 2017  (CN) .......................... 2017 1 0522389

(51) Int. Cl.
*H01L 29/66*  (2006.01)
*H01L 29/786*  (2006.01)
(Continued)

(52) U.S. Cl.
CPC .. *H01L 29/66969* (2013.01); *H01L 21/02244* (2013.01); *H01L 21/44* (2013.01);
(Continued)

(58) Field of Classification Search
CPC ......... H01L 29/66969; H01L 29/41733; H01L 29/7869; H01L 29/78618; H01L 21/02244; H01L 21/44; H01L 29/4908; H01L 29/41775; H01L 21/467; H01L 29/45; H01L 21/477; H01L 27/1225
See application file for complete search history.

(56) References Cited

U.S. PATENT DOCUMENTS

2004/0263746 A1* 12/2004 Cho .................... G02F 1/13439
                                                         349/139
2007/0145374 A1*  6/2007 Whangbo ........... H01L 29/4908
                                                         257/72

(Continued)

FOREIGN PATENT DOCUMENTS

CN      101609843 A    12/2009
CN      104241392 A    12/2014

*Primary Examiner* — John P Dulka
(74) *Attorney, Agent, or Firm* — Anova Law Group, PLLC

(57) ABSTRACT

An array substrate, a fabrication method thereof, and a display panel are provided. The array substrate comprises a substrate, and a plurality of thin-film-transistors, which includes an active layer formed on the substrate including a source region, a drain region, and a channel region located between the source region and the drain region, a source electrode metal contact layer, a drain electrode metal contact layer, a barrier layer formed on a side of the active layer facing away from the substrate, a source electrode formed on a side of the source electrode metal contact layer facing away from active layer, a drain electrode formed on a side of the drain electrode metal contact layer facing away from the active layer, and a gate electrode insulated from the barrier layer and formed on a side of the barrier layer facing away from the active layer.

17 Claims, 8 Drawing Sheets

(51) Int. Cl.
*H01L 29/49* (2006.01)
*H01L 29/417* (2006.01)
*H01L 21/44* (2006.01)
*H01L 21/02* (2006.01)
H01L 27/12 (2006.01)
H01L 29/45 (2006.01)
H01L 21/477 (2006.01)
H01L 21/467 (2006.01)

(52) U.S. Cl.
CPC .. *H01L 29/41733* (2013.01); *H01L 29/41775* (2013.01); *H01L 29/4908* (2013.01); *H01L 29/7869* (2013.01); *H01L 29/78618* (2013.01); H01L 21/467 (2013.01); H01L 21/477 (2013.01); H01L 27/1225 (2013.01); H01L 29/45 (2013.01)

(56) References Cited

U.S. PATENT DOCUMENTS

2012/0280237 A1\* 11/2012 Kwack ................ H01L 27/1288 257/59
2013/0107155 A1\* 5/2013 Guo ...................... G02F 1/1368 349/43

\* cited by examiner

ARRAY SUBSTRATE, FABRICATION METHOD, AND DISPLAY PANEL

CROSS-REFERENCES TO RELATED APPLICATIONS

This application claims the priority of Chinese Patent Application No. CN201710522389.X, filed on Jun. 30, 2017, the entire contents of which are incorporated herein by reference.

FIELD OF THE DISCLOSURE

The present disclosure generally relates to the display technology and, more particularly, relates to an array substrate, a fabrication method of the array substrate, and a display panel.

BACKGROUND

Thin-film-transistor is a type of field effect transistor. Due to high electron mobility, small sub-threshold swing, and low off-state current, thin-film-transistors are often essential components in flat panel display (e.g., liquid crystal display), and play an important role in display performance.

A thin-film-transistor may include an active layer, a source electrode, a gate electrode, and a drain electrode. The active layer may be divided into a source region, a drain region, and a channel region. In a thin-film-transistor, a contact resistance between the source and drain electrodes and the active layer, and a channel region resistance may be the key factors in determining the quality of the thin-film-transistor component. In operation of the thin-film-transistor, a small contact resistance between the source and drain electrodes and the active layer and a high carrier concentration are often desired. The channel region needs to be in a semiconducting state. A high resistance and a low carrier concentration in the channel region are often desired.

In existing technology, the contact resistance between the source and drain electrodes and the active layer and the channel region resistance are often improved by plasma bombardment of the active layer. For example, the channel region may be treated by $N_2O$ and $O_2$ plasma to increase the channel region resistance. The source region and the drain region may be treated by He and Ar plasma to reduce the contact resistance between the source and drain electrodes and the active layer. However, the plasma bombardment of the surface of the active layer may change the surface structure of the active layer, and cause a reduction in carrier mobility. Further, carriers may diffuse from high concentration region into low concentration region. The carrier diffusion may increase the carrier concentration in the channel region, and change on-off characteristics of the component. To certain extent, the semiconductor is turned into a conductor, and the thin-film-transistor is turned into a conducting state, thereby causing instability in performance.

The disclosed array substrate, fabrication method for the array substrate, and display panel are directed to solve one or more problems set forth above and other problems.

BRIEF SUMMARY OF THE DISCLOSURE

One aspect of the present disclosure provides an array substrate, comprising a substrate, and a plurality of thin-film-transistors. The thin-film-transistor includes an active layer formed on the substrate including a source region, a drain region, a channel region located between the source region and the drain region, a source electrode metal contact layer, a drain electrode metal contact layer, a barrier layer formed on a side of the active layer facing away from the substrate, a source electrode formed on a side of the source electrode metal contact layer facing away from active layer, a drain electrode formed on a side of the drain electrode metal contact layer facing away from the active layer, and a gate electrode insulated from the barrier layer and formed on a side of the barrier layer facing away from the active layer. The source electrode metal contact layer, the drain electrode metal contact layer, and the barrier layer are different regions of a same layer. The source electrode metal contact layer has an orthogonal projection on the active layer overlapping with the source region. The drain electrode metal contact layer has an orthogonal projection on the active layer overlapping with the drain electrode. The barrier layer is located between the source electrode metal contact layer and the drain electrode metal contact layer, and has an orthogonal projection on the active layer overlapping with the channel region. The source electrode is electrically connected to the source region in the active layer through the source electrode metal contact layer. The drain electrode is electrically connected to the drain region in the active layer through the drain electrode metal contact layer.

Another aspect of the present disclosure provides a fabrication method for the array substrate, comprising providing a substrate, and forming a plurality of thin-film-transistors on the substrate. Forming a plurality of thin-film-transistors on the substrate includes forming an active layer on the substrate including a source region, a drain region, and a channel region located between the source region and the drain region, forming a source electrode metal contact layer, a drain electrode metal contact layer, and a barrier layer on a side of the active layer facing away from the substrate, forming a source electrode on a side of the source electrode metal contact layer facing away from the active layer, forming a drain electrode on a side of the drain electrode metal contact layer facing away from the active layer, and forming a gate electrode on a side of the barrier layer facing away from the active layer. The source electrode metal contact layer, the drain electrode contact layer, and the barrier layer are coplanar with each other. The source electrode metal contact layer has an orthogonal projection on the active layer overlapping with the source region. The drain electrode metal contact layer has an orthogonal projection on the active layer overlapping with the drain electrode. The barrier layer is located between the source electrode metal contact layer and the drain electrode metal contact layer, and has an orthogonal projection on the active layer overlapping with the channel region. The source electrode is electrically connected to the source region in the active layer through the source electrode metal contact layer. The drain electrode is electrically connected to the drain region in the active layer through the drain electrode metal contact layer.

Another aspect of the present disclosure provides a display panel, comprising a disclosed array substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. Other embodiments obtained by those skilled in the art without making creative work are within the scope of the present invention.

Figure 1:
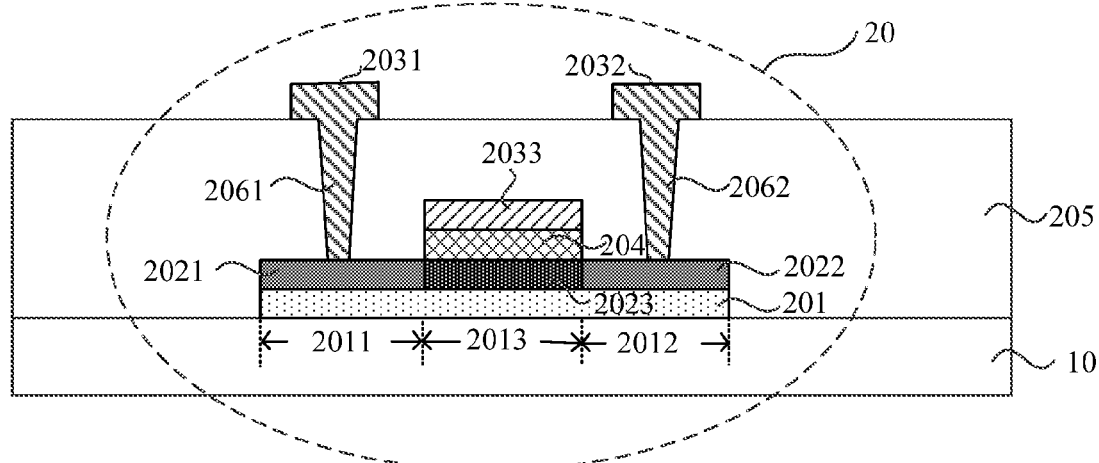
FIG. 1 illustrates a cross-sectional view of an exemplary array substrate according to the disclosed embodiments.

FIG. 1 illustrates a cross-sectional view of an exemplary array substrate according to the present disclosure. For illustration purpose, only a single thin-film-transistor is shown in FIG. 1. As shown in FIG. 1, the array substrate according to the present disclosure may include a substrate 10 and a thin-film-transistor 20.

The thin-film-transistor 20 may include an active layer 201. The active layer 201 may include a source region 2011, a drain region 2012, and a channel region 2013 disposed between the source region 2011 and the drain region 2012.

A source electrode metal contact layer 2021, a drain electrode metal contact layer 2022, and a barrier layer 2023 may be disposed on a side of the active layer 201 facing away from the substrate 10. The drain electrode metal contact layer 2021, the drain electrode metal contact layer 2022, and a barrier layer 2023 may be different regions of a same layer. The source electrode metal contact layer 2021 may have an orthogonal projection on the active layer 201 overlapping with the source region 2011. The drain electrode metal contact layer 2022 may have an orthogonal projection on the active layer 201 overlapping with the drain region 2012. The barrier layer 2023 may be disposed between the source electrode metal contact layer 2021 and the drain electrode metal contact layer 2022, and may have an orthogonal projection on the active layer 201 overlapping with the channel region 2013.

A source electrode 2031 may be disposed on a side of the source electrode metal contact layer 2021 facing away from the active layer 201. A drain electrode 2032 may be disposed on a side of the drain electrode metal contact layer 2022 facing away from the active layer 201. A gate electrode 2033 may be disposed on a side of the barrier layer 2023 facing away from the active layer 201. As such, the source electrode 2031 may be connected to the source region 2011 of the active layer 201 through the source electrode metal contact layer 2021, and the drain electrode 2032 may be connected to the drain electrode 2012 of the active layer 201 through the drain electrode metal contact layer 2022.

As shown in FIG. 1, the source electrode metal contact layer 2021, the drain electrode metal contact layer 2022, and the barrier layer 2023 may be formed on the active layer 201. The source electrode 2031 may be connected to the source region 2011 of the active layer 201 through the source electrode metal contact layer 2021. The drain electrode 2032 may be connected to the drain region 2012 of the active layer 201 through the drain electrode metal contact layer 2022. Because the source electrode metal contact layer 2021 and the drain electrode metal contact layer 2022 are made of metallic material, the metallic material may have a carrier concentration greater than the carrier concentration in the source region 2011 and the drain the region 2012. Thus, the electrical connection between the source electrode 2031 and the source region 2011 through the source electrode metal contact layer 2021 and the electrical connection between the drain electrode 2032 and the drain region 2012 through the drain electrode metal contact layer 2022 may ensure a high carrier concentration in the source region 2011 and the drain region 2012, minimize contact resistance between the source electrode 2031 and the source region 2011 and between the drain electrode 2032 and the drain region 2012, and improve the conductivity of the thin-film-transistor 20.

In one embodiment, the barrier layer 2023 may have an orthogonal projection on the active layer 201 overlapping with the channel region 2013 such that the barrier layer 2023 may block hydrogen atoms in other layers from affecting the surface of the channel region 2023, prevent a rise of carrier concentration on the surface of the channel region 2023, and maintain the semiconducting characteristics of the channel region 2023. At the same time, the barrier layer 2023 may prevent the channel region 2013 from damages by development liquid or etching solution in the process of the array substrate fabrication, ensure no characteristic change in the channel region 2013, and improve the stability of the thin-film-transistor. In addition, the source electrode metal contact layer 2021, the drain electrode metal contact layer 2022, and the barrier layer 2023 may be different regions of a same layer, which simplifies the process of fabricating the source electrode metal contact layer 2021, the drain electrode metal contact layer, and the barrier layer 2023, and, in the meantime, makes the thin-film-transistor 20 have a thin thickness, thus achieving a thinner design of the array substrate.

Further, in the array substrate according to the present disclosure, the source electrode metal contact layer, the drain electrode metal contact layer, and the barrier layer are formed on the surface of the active layer. The source electrode metal contact layer and the drain electrode contact layer increase the carrier concentration in the source and drain regions, and reduce the contact resistance between the source and drain electrodes and the active layer. Through blocking hydrogen atoms of other layers, development liquid, or etching solution from damaging the surface of the channel region, the barrier layer prevents the rise of the carrier concentration in the channel region, maintains the semiconducting characteristic of the channel region, and improves the stability of the thin-film-transistor. The plasma process applied to the active layer in the existing technology changes surface structure of the active layer and causes the reduction of carrier mobility. In addition, when the surface of the active layer is subject to the plasma process, the carriers diffuse from high concentration regions such as the source region and the drain region to low concentration regions such as the channel region. Thus, the carrier concentration in the channel region increases, the semiconducting characteristic disappears, the channel region becomes a conducting region, the thin-film-transistor loses the switching characteristic, and the stability of the thin-film-transistor is destroyed.

In one embodiment, referring to FIG. 1, the thin-film-transistor 20 according to the present disclosure may also include a gate electrode insulation layer 204. Disposed between the barrier layer 2023 and the gate electrode 2033, the gate electrode insulation layer 204 may be configured to insulate between the gate electrode 2033 and the barrier layer 2023. In another embodiment, the gate electrode insulation layer 204 may be made of silicon oxide or silicon nitride.

In one embodiment, referring to FIG. 1, the thin-film-transistor 20 according to the present disclosure may also include an interlayer insulation layer 205. The interlayer insulation layer 205 may be disposed on the substrate 10, the source electrode metal contact layer 2021, the gate electrode 2033, and the drain electrode metal contact layer 2022. A first opening 2061 and a second opening 2062 may be formed on the interlayer insulation layer 205. The source electrode 2031 may be electrically connected to the source electrode metal contact layer 2021 through the first opening 2061. The drain electrode 2032 may be electrically connected to the drain electrode metal contact layer 2022 through the second opening 2062. In another embodiment, the interlayer insulation layer 205 may be made of silicon oxide or silicon nitride.

In one embodiment, the active layer 201 may be made of a semiconductor oxide material such as indium gallium zinc oxide (IGZO). When the active layer 201 is made of IGZO, carrier concentration at the surface of IGZO may rise due to IGZO's sensitivity to temperature, ambient and other layer fabrication process conditions, and especially hydrogen atoms because hydrogen atoms are able to capture oxygen atoms from IGZO. Particularly in the channel region 2013, hydrogen atoms may capture oxygen atoms from the surface of the channel region 2013 to cause the carrier concentration on the surface of the channel region 2013 to rise, thus destroying the semiconducting characteristic of the channel region 2013. The conducting characteristic of the thin-film-transistor 20 may be changed. Further, the thin-film-transistor 20 may be changed from a semiconductor to a conductor, always conducting.

In one embodiment, a barrier layer 2023 may be formed on the surface of the channel region 2013. The barrier layer 2023 may have an orthogonal projection on the active layer 201 overlapping with the channel region 2013. Consequently, the barrier layer 2023 may block hydrogen atoms from other upper layers such as the gate electrode insulation layer 204 from causing damages to channel region 2013, and may maintain the semiconducting characteristic of the channel region 2013. Thus, the switching characteristic and the stability of the thin-film-transistor 20 may be ensured, and the life span of the thin-film-transistor 20 may be extended.

In another embodiment, the barrier layer 2023 may be made of an insulating metal oxide or metal nitride material such that the barrier layer 2023 is ensured not to affect the channel region 2013 and the normal operation of the thin-film-transistor 20 is ensured.

In another embodiment, the source electrode metal contact layer 2021 and the drain electrode metal contact layer 2022 may be made of at least one of titanium, molybdenum, aluminum, and silver such that the source electrode metal contact layer 2021 and the drain electrode metal contact layer 2022 may be ensured to have substantially high carrier concentration, and the contact resistance between the source electrode 2031 and the source region 2011 and between the drain electrode 2032 and the drain region 2012 may be reduced.

In another embodiment, the source electrode metal contact layer 2021 and the drain electrode metal contact layer 2022 may have a thickness of approximately 2 nm-50 nm. Thus, the source electrode metal contact layer 2021 and the drain electrode metal contact layer 2022 may have a substantially thin thickness to ensure a thin thickness of the thin-film-transistor, which is suitable for thinner array substrate design of display.

In another embodiment, the barrier layer 2023 may be made of at least one of titanium, molybdenum, aluminum, and silver oxide or nitride. The barrier layer 2023 may be used to block hydrogen atoms of other layers, etching solution, or development liquid from damaging the surface of the channel region 2013. In addition, the barrier layer 2023 itself may not react with the channel region 2013. Thus, the rise of carrier concentration in the channel region 2013 may be avoided, and the stability of the thin-film-transistor 20 may be ensured.

In another embodiment, the barrier layer 2023 may have a thickness of approximately 2 nm-50 nm. Because the barrier layer 2023, the source electrode metal contact layer 2021, and the drain electrode metal contact layer 2022 are different regions of s same layer, the barrier layer 2023 may have a thickness same as the thickness of the source electrode metal contact layer 2021 and the drain electrode metal contact layer.

Figure 2:
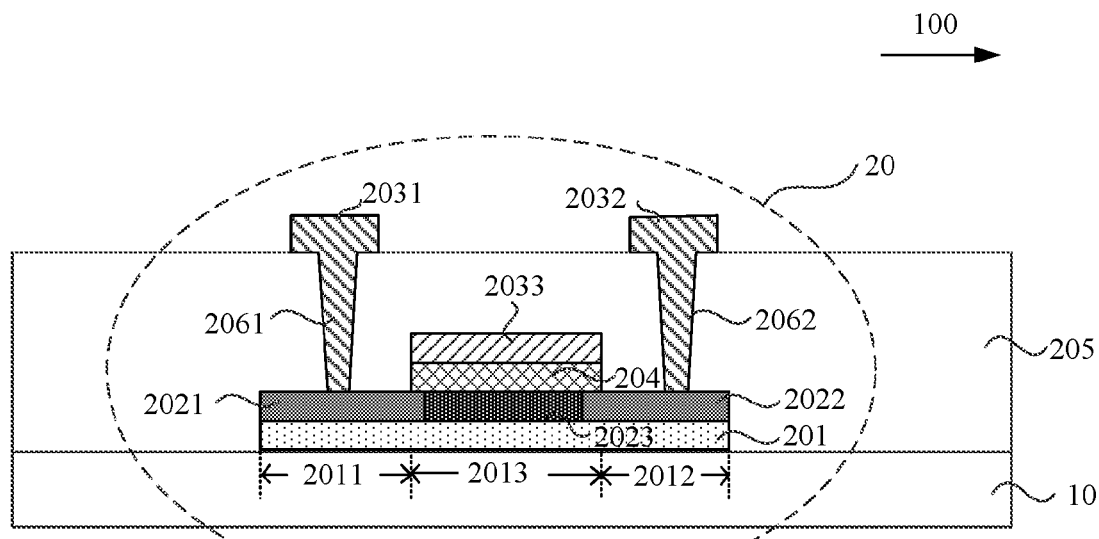
FIG. 2 illustrates a cross-sectional view of another exemplary array substrate according to the disclosed embodiments.

FIG. 2 illustrates a cross-sectional view of another exemplary array substrate according to the present disclosure. The difference between the array substrate in FIG. 2 and the array substrate in FIG. 1 may be that, in FIG. 2, the gate electrode 2033 may have an orthogonal projection on the plane where the source electrode metal contact layer 2021 and the drain electrode metal contact layer 2022 are located overlapping with the source electrode metal contact layer 2021 and the drain electrode metal contact layer 2022. As shown in FIG. 2, the source electrode metal contact layer 2021, the drain electrode metal contact layer 2022, and the barrier layer 2023 may be different regions in a same layer. The source electrode metal contact layer 2021 may have an orthogonal projection on the active layer 201 overlapping with the source region 2011. The drain electrode metal contact layer 2022 may have an orthogonal projection on the active layer 201 overlapping with the drain region 2012. The barrier layer 2023 may have an orthogonal projection on the active layer 201 overlapping with the channel region 2013.

Because the gate electrode 2033 has an orthogonal projection on the active layer 201 corresponding to the channel region 2013, generally, the gate electrode 2033 may have an orthogonal projection on the active layer 201 coinciding with the channel region 2013. It is configured that the gate electrode 2033 has an orthogonal projection on the source electrode metal contact layer 2021 and the drain electrode metal contact layer 2022 overlapping with the source electrode metal contact layer 2021 and the drain electrode metal contact layer 2022. It is ensured that the source electrode metal contact layer 2021 and the drain electrode metal contact layer 2022 have orthogonal projections on the active layer 201 overlapping with the channel region 2013. Thus, it is ensured that, in a first direction 100, no gap exists between the source electrode metal contact layer 2021 and the channel region 2013 and between the drain electrode metal contact layer 2022 and the channel region 2013. As a result, the process control difficulty may be reduced. In addition, the reliable electrical connections may exist between the source electrode metal contact layer 2021 and the channel region 2013 and between the drain electrode metal contact layer 2022 and the channel region 2013, to ensure the normal operation of the thin-film-transistor 20.

Figure 3:
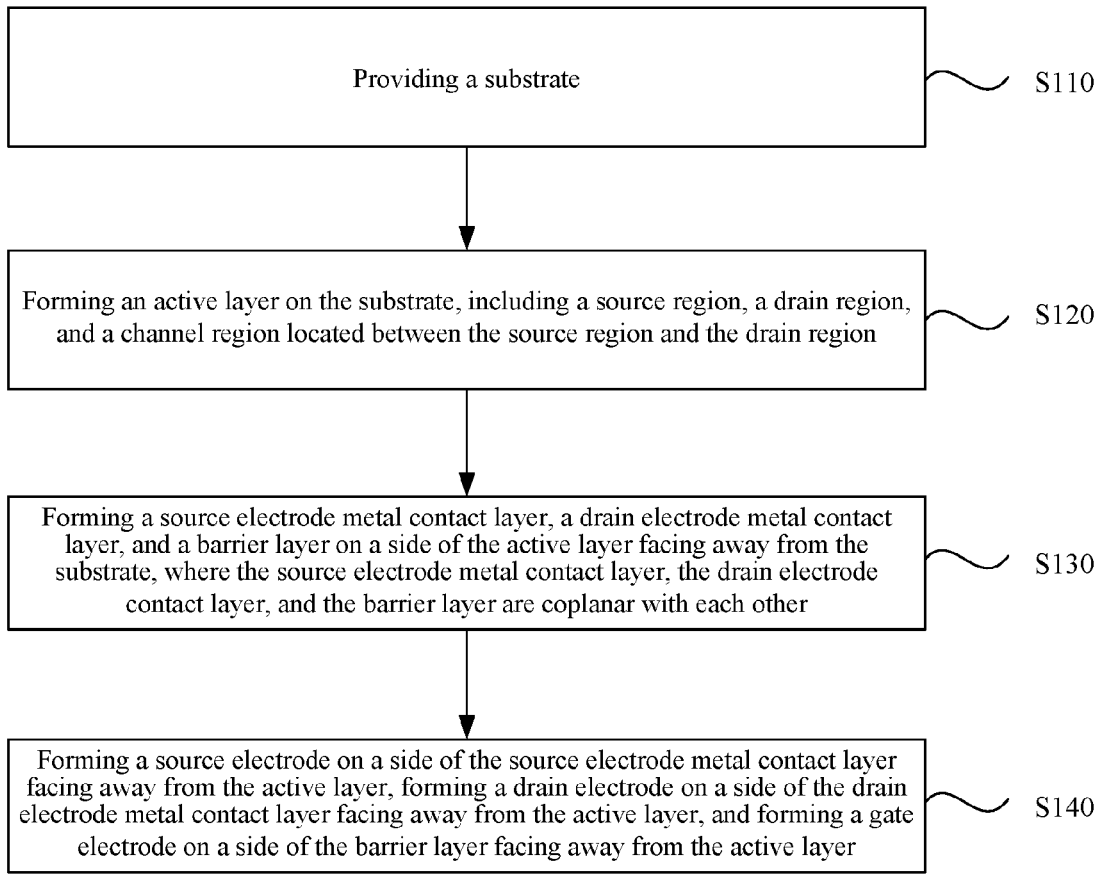
FIG. 3 illustrates a flow chart of an exemplary fabrication method for the array substrate according to the disclosed embodiments.

FIG. 3 illustrates a flow chart of an exemplary fabrication method for the array substrate according to the present disclosure. For illustration purpose, an array substrate including only a single thin-film-transistor is shown in the fabrication method in FIG. 3. The same fabrication method may be used to fabricate array substrates including a plurality of thin-film-transistors. As shown in FIG. 3, the fabrication method according to the present disclosure may include the following steps.

Step S110: providing a substrate.

Figure 4:
FIG. 4 illustrates a cross-sectional view of an exemplary substrate according to the disclosed embodiments.

FIG. 4 illustrates a cross-sectional view of an exemplary substrate according to the present disclosure. As shown in FIG. 4, the substrate 10 may be a flexible substrate. The substrate 10 may be made of at least one of polyimide, polyethylene terephthalate, polyethylene naphthalate, polycarbonate, polyacrylate, and polyethersulfone. The substrate 10 may also be a rigid substrate. Particularly, the substrate 10 may be a glass substrate or other rigid substrate. The type or material of the substrate is not limited by the present disclosure.

Step S120: forming an active layer on the substrate, including a source region, a drain region, and a channel region located between the source region and the drain region.

Figure 5:
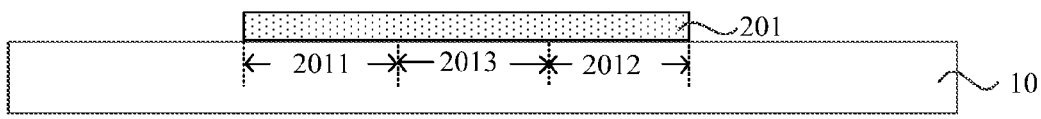
FIG. 5 illustrates a cross-sectional view of forming an exemplary active layer on the substrate according to the disclosed embodiments.

FIG. 5 illustrates a cross-sectional view of forming an exemplary active layer on the substrate according to the present disclosure. As shown in FIG. 5, the active layer 201 may include a source region 2011, a drain region 2012, and a channel region 2013 located between the source region 2011 and the drain region 2012.

In one embodiment, an active layer 201 may be formed on the substrate 10. Particularly, the active layer 201 may be formed on the substrate 10 by a physical vapor deposition method.

Step S130: forming a source electrode metal contact layer, a drain electrode metal contact layer, and a barrier layer on a side of the active layer facing away from the substrate, where the source electrode metal contact layer, the drain electrode contact layer, and the barrier layer are coplanar with each other.

Figure 6:
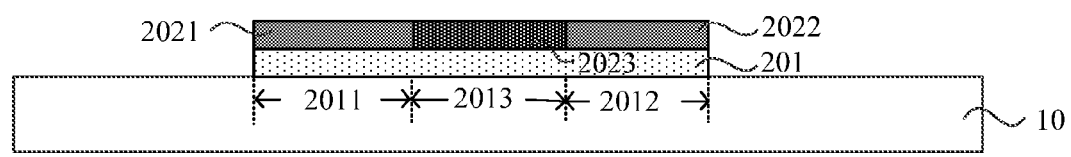
FIG. 6 illustrates a cross-sectional view of forming an exemplary source electrode metal contact layer, an exemplary drain electrode metal contact layer, and an exemplary barrier layer according to the disclosed embodiments.

FIG. 6 illustrates a cross-sectional view of forming an exemplary source electrode metal contact layer, an exemplary drain electrode metal contact layer, and an exemplary barrier layer according to the present disclosure. As shown in FIG. 6, the source electrode metal contact layer 2021, the drain electrode metal contact layer 2022, and the barrier layer 2023 are disposed on the side of the active layer 201 facing away from the substrate 10. The source electrode metal contact layer 2021, the drain electrode metal contact layer 2022, and the barrier layer 2023 may be different structures in a same layer.

In the fabrication process, the source electrode metal contact layer 2021, the drain electrode metal contact layer 2022, and the barrier layer 2023 may be coplanar with each other. The source electrode metal contact layer 2021 may have an orthogonal projection on the active layer 201 overlapping with the source region 2011. The drain electrode metal contact layer 2022 may have an orthogonal projection on the active layer 201 overlapping with the drain region 2012. The barrier layer 2023 may be located between the source electrode metal contact layer 2021 and the drain electrode metal contact layer 2022, and may have an orthogonal projection on the active layer 201 overlapping with the channel region 2013.

Step S140: forming a source electrode on a side of the source electrode metal contact layer facing away from the active layer, forming a drain electrode on a side of the drain electrode metal contact layer facing away from the active layer, and forming a gate electrode on a side of the barrier layer facing away from the active layer.

In one embodiment, a physical vapor deposition method may be used to form a source electrode 2031 on a side of the source electrode metal contact layer 2021 facing away from the active layer 201, forming a drain electrode 2032 on a side of the drain electrode metal contact layer 2022 facing away from the active layer 201, and forming a gate electrode 2033 on a side of the barrier layer 2023 facing away from the active layer 201. The gate electrode 2033 and the barrier layer 2023 may be insulated from each other. The source electrode 2031 may be electrically connected to the source region 2011 in the active layer 201 through the source electrode metal contact layer 2021. The drain electrode 2032 may be electrically connected to the drain region 2012 in the active layer 201 through the drain electrode metal contact layer 2022.

Further, the fabrication method according to the present disclosure includes forming a source electrode metal contact layer, a drain electrode metal contact layer, and a barrier layer on a side of the active layer facing away from the substrate, forming a source electrode on the source electrode metal contact layer, forming a drain electrode on the drain electrode metal contact layer, and forming a gate electrode on the barrier layer. The source electrode is electrically connected to the source region in the active layer through the source electrode metal contact layer. The drain electrode is electrically connected to the drain region in the active layer through the drain electrode metal contact layer. The source electrode metal contact layer and the drain electrode metal contact layer increase the carrier concentration in the source region and the drain region, and reduce contact resistance between the source electrode and the active layer and between the drain electrode and the active layer. The barrier layer blocks hydrogen atoms, development liquid, or etching solution from damaging the surface of the channel region, avoids a rise of carrier concentration in the channel region, ensures semiconducting characteristic of the channel region, and improves the stability of the thin-film-transistor.

In another embodiment, forming the source electrode 2031 on the side of the source electrode metal contact layer 2021 facing away from the active layer 201, forming the drain electrode 2032 on the side of the drain electrode metal contact layer 2022 facing away from the active layer 201, and forming the gate electrode 2033 on the side of the barrier layer 2023 facing away from the active layer 201 may include the following sub-steps.

A gate electrode insulation layer 204 may be formed on a side of the barrier layer 2023 facing away from the active layer 201 by a plasma enhanced chemical vapor deposition method.

A gate electrode 2033 may be formed on a side of the gate electrode insulation layer 204 facing away from the barrier layer 2023.

An interlayer insulation layer 205 may be formed on the substrate 10, the source electrode metal contact layer 2021, the gate electrode 2033, and the drain electrode metal contact layer 2022 by the plasma enhanced chemical vapor deposition method.

A first opening 2061 may be formed on the interlayer insulation layer 205 in a position corresponding to the source electrode metal contact layer 2021. A second opening 2062 may be formed on the interlayer insulation layer 205 in a position corresponding to the drain electrode metal contact layer 2022.

A source electrode 2031 may be formed in the first opening 2061 on the interlayer insulation layer 205. A drain electrode 2032 may be formed in the second opening 2062 on the interlayer insulation layer 205.

Figure 7A:
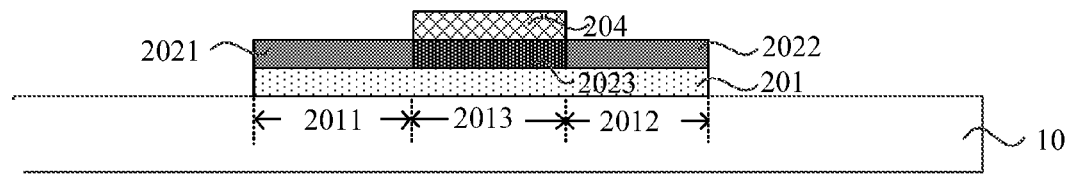
FIG. 7a illustrates a cross-sectional view of forming an exemplary gate insulation layer according to the disclosed embodiments.

FIG. 7a illustrates a cross-sectional view of forming an exemplary gate insulation layer according to the present disclosure. As shown in FIG. 7a, a gate insulation layer 204 may be formed on a side of the barrier layer 203 facing away from the active layer 201.

Figure 7B:
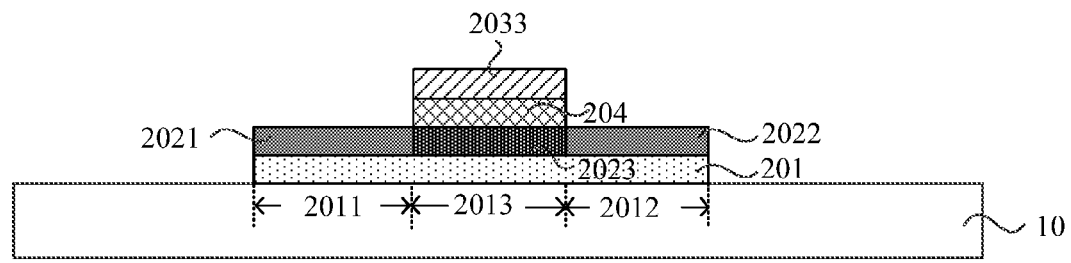
FIG. 7b illustrates a cross-sectional view of forming an exemplary gate electrode according to the disclosed embodiments.

FIG. 7b illustrates a cross-sectional view of forming an exemplary gate electrode according to the present disclosure. As shown in FIG. 7b, a gate electrode 2033 may be formed on the gate insulation layer 204. The gate electrode 2033 and the barrier layer 2023 may be insulated from each other. In another embodiment, the gate insulation layer 204 may be made of silicon oxide or silicon nitride.

Figure 7C:
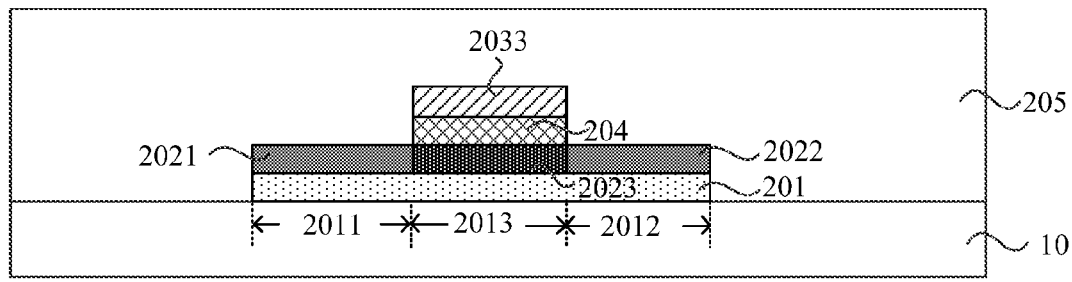
FIG. 7c illustrates a cross-sectional view of forming an exemplary insulating layer between layers according to the disclosed embodiments.

FIG. 7c illustrates a cross-sectional view of forming an exemplary insulating layer between layers according to the present disclosure. As shown in FIG. 7c, an interlayer insulation layer 205 may be formed on the substrate, the source electrode metal contact layer 2021, the gate electrode 2033, and the drain electrode metal contact layer 2022. In another embodiment, the interlayer insulation layer 205 may be made of silicon oxide or silicon nitride.

Figure 7D:
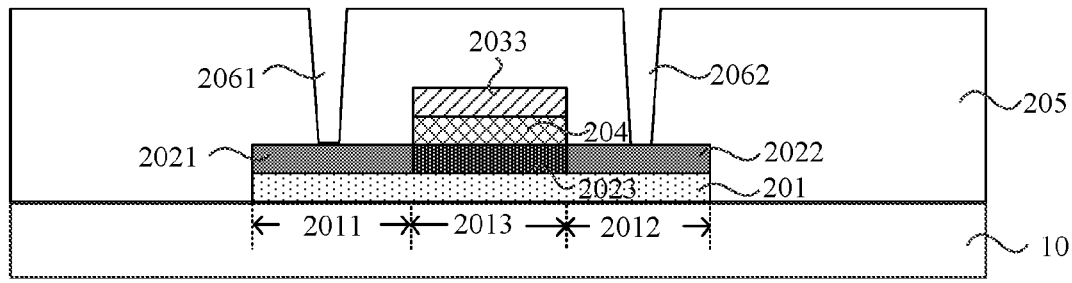
FIG. 7d illustrates a cross-sectional view of forming an exemplary first opening and an exemplary second opening according to the disclosed embodiments.

FIG. 7d illustrates a cross-sectional view of forming an exemplary first opening and an exemplary second opening according to the present disclosure. As shown in FIG. 7d, a first opening 2061 may be formed on the interlayer insulation layer 205 in a position corresponding to the source electrode metal contact layer 2021, and a second opening 2062 may be formed on the interlayer insulation layer 205 in a position corresponding to the drain electrode metal contact layer 2022.

Figure 7E:
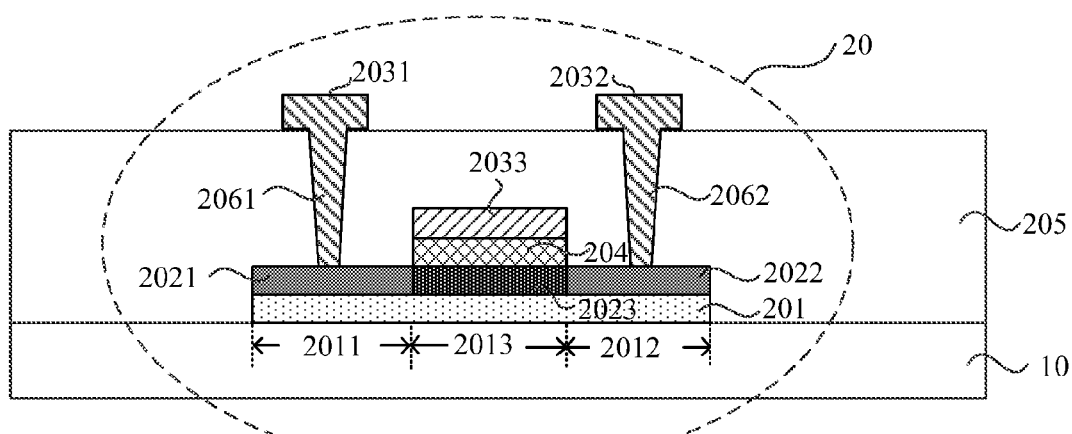
FIG. 7e illustrates a schematic view of forming an exemplary source electrode and an exemplary drain electrode according to the disclosed embodiments.

FIG. 7e illustrates a schematic view of forming an exemplary source electrode and an exemplary drain electrode according to the present disclosure. As shown in FIG. 7e, a source electrode 2031 may be formed in the first opening 2061 on the interlayer insulation layer 205, and a drain electrode 2032 may be formed in the second opening 2062 on the interlayer insulation layer 205. The source electrode 2031 may be electrically connected to the source region 2011 in the active layer 201 through the source electrode metal contact layer 2021. The drain electrode 2032 may be electrically connected to the drain region 2012 in the active layer 201 through the drain electrode metal contact layer 2022.

In one embodiment, the active layer 201, the source electrode metal contact layer 2021, the drain electrode metal contact layer 2022, the barrier layer 2023, the source electrode 2031, the drain electrode 2032, the gate electrode 2033, the gate insulation layer 204 and the interlayer insulation layer 205 together may form the thin-film-transistor 20.

Figure 8:
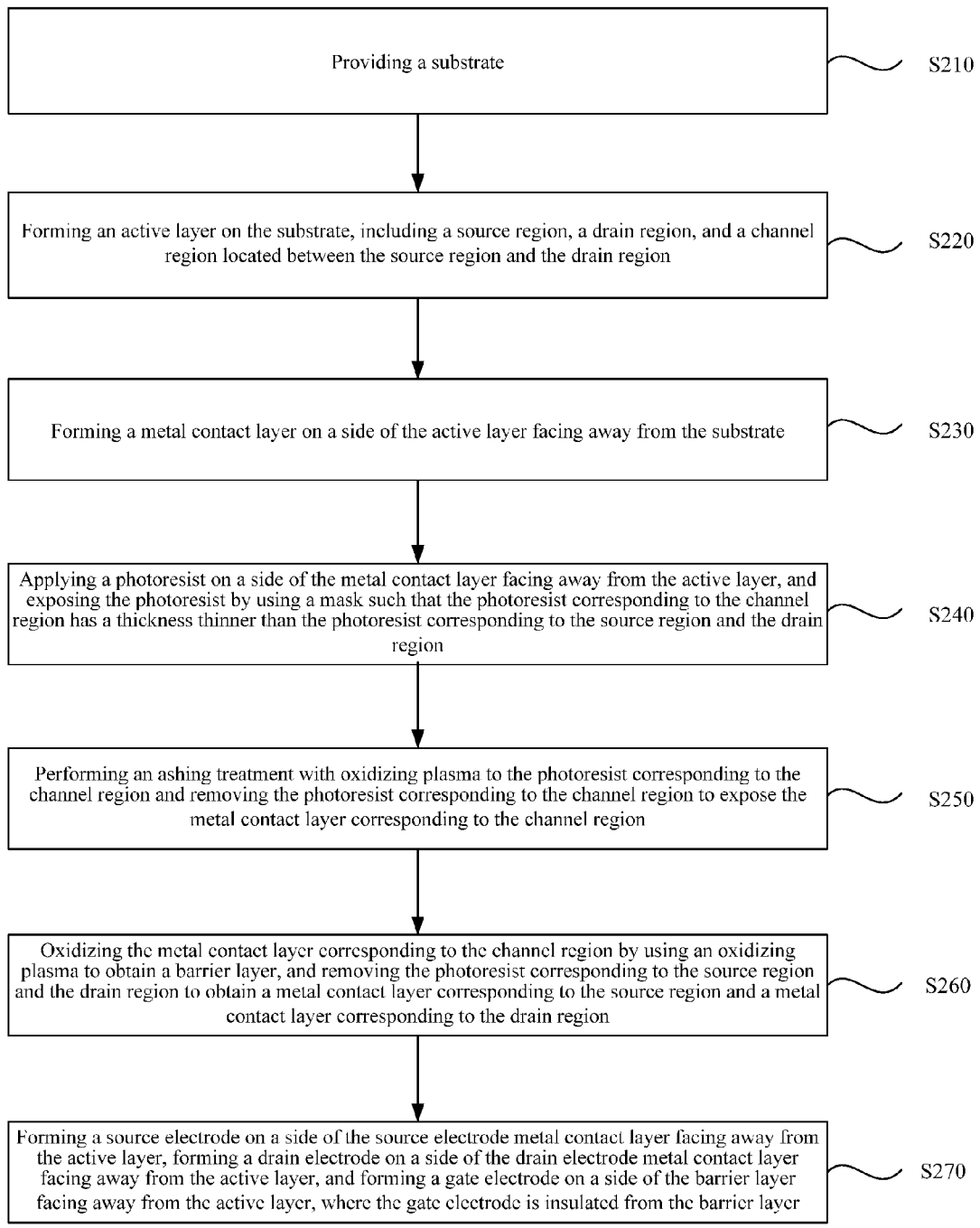
FIG. 8 illustrates a flow chart of another exemplary fabrication method for the array substrate according to the disclosed embodiments.

FIG. 8 illustrates a flow chart of another exemplary fabrication method for the array substrate according to the present disclosure. For illustration purpose, an array substrate including only a single thin-film-transistor is shown in the fabrication method in FIG. 3. The same fabrication method may be used to fabricate array substrates including a plurality of thin-film-transistors. As shown in FIG. 8, the fabrication method according to the present disclosure may include the following steps.

Step S210: providing a substrate.

Referring to FIG. 4, the substrate 10 may be a flexible substrate or a rigid substrate. The type or material of the substrate is not limited by the present disclosure.

Step S220: forming an active layer on the substrate, including a source region, a drain region, and a channel region located between the source region and the drain region.

Referring to FIG. 5, the active layer 201 may include a source region 2011, a drain region 2012, and a channel region 2013 located between the source region 2011 and the drain region 2012. In another embodiment, the active layer 201 may be formed on the substrate 10 by a physical vapor deposition (PVD) method.

Step S230: forming a metal contact layer on a side of the active layer facing away from the substrate.

Figure 9:
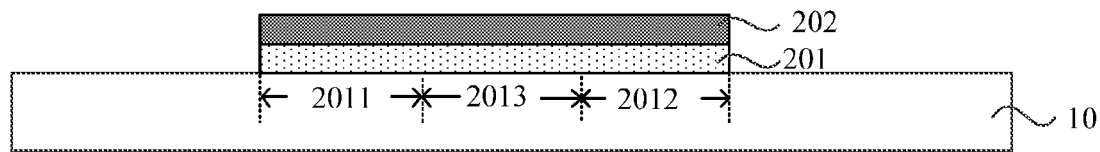
FIG. 9 illustrates a cross-sectional view of forming an exemplary metal contact layer according to the disclosed embodiments.

FIG. 9 illustrates a cross-sectional view of forming an exemplary metal contact layer according to the present disclosure. As shown in FIG. 9, a metal contact layer 202 may be disposed on a side of the active layer 201 facing away from the substrate 10. In one embodiment, the metal contact layer 202 may be made of at least one of titanium, molybdenum, aluminum, and silver, and may have a thickness of approximately 2 nm-50 nm.

In one embodiment, the metal contact layer 202 may be formed on the side of the active layer 201 facing away from the substrate 20. Particularly, the metal contact layer 202 may be formed by a physical vapor deposition method, having a sputtering power of approximately 5 KW-15 KW, a pressure of approximately 0.1 Pa-5 Pa, an argon gas flow rate of approximately 50 sccm-200 sccm, and a sputtering time of approximately 5 s-100 s.

Step S240: applying a photoresist on a side of the metal contact layer facing away from the active layer, and exposing the photoresist by using a mask such that the photoresist corresponding to the channel region has a thickness thinner than the photoresist corresponding to the source region and the drain region.

Figure 10A:
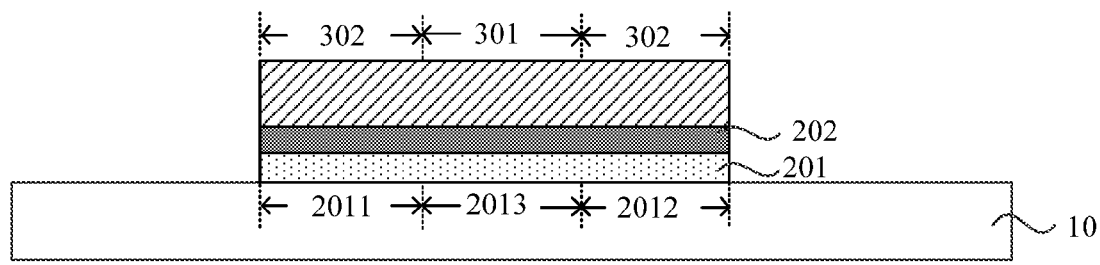
FIG. 10a illustrates a cross-sectional view of applying an exemplary photoresist according to the disclosed embodiments.
Figure 10B:
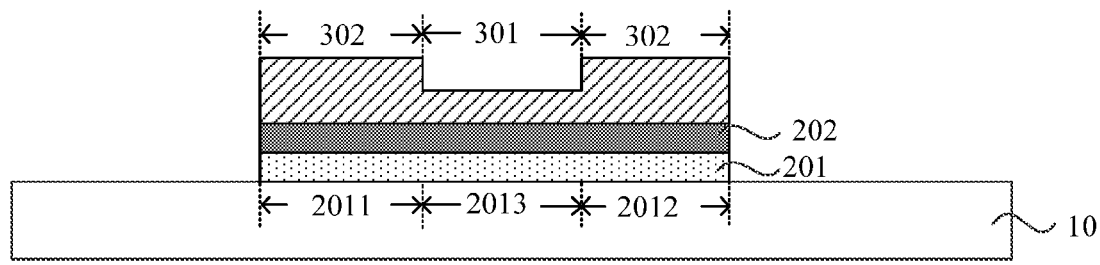
FIG. 10b illustrates a cross-sectional view of etching an exemplary photoresist according to the disclosed embodiments.

FIG. 10a illustrates a cross-sectional view of applying an exemplary photoresist according to the present disclosure. FIG. 10b illustrates a cross-sectional view of etching an exemplary photoresist according to the present disclosure. As shown in FIG. 10a and FIG. 10b, a photoresist 30 may be applied on the metal contact layer 202. The photoresist 30 may include a first type of photoresist 301 corresponding to the channel region 2013 and a second type of photoresist 302 corresponding to the source region 2011 and the drain region 2012. The first type of photoresist 301 may have an orthogonal projection on the active layer 201 overlapping with the channel region 2013. The second type of photoresist 302 may have an orthogonal projection on the active layer 201 overlapping with the source region 2011 and the drain region 2012.

In one embodiment, the photoresist 30 may be a positive photoresist or a negative photoresist, which is not limited by the present disclosure. Then, the photoresist 30 may be exposed through a mask (not shown in the drawings) such that the first type of photoresist 301 corresponding to the channel region 2013 has a thickness thinner than the second type of photoresist 302 corresponding to the source region 2011 and the drain region 2012.

Step S250: performing an ashing treatment with oxidizing plasma to the photoresist corresponding to the channel region and removing the photoresist corresponding to the channel region to expose the metal contact layer corresponding to the channel region.

Figure 11:
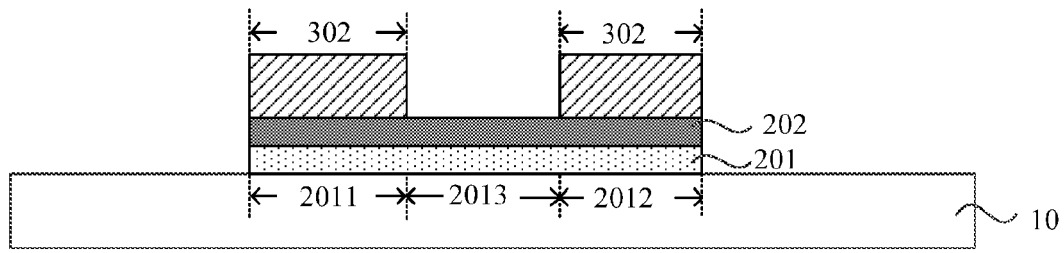
FIG. 11 illustrates a cross-sectional view of removing an exemplary photoresist corresponding to the channel region according to the disclosed embodiments.

FIG. 11 illustrates a cross-sectional view of removing an exemplary photoresist corresponding to the channel region according to the present disclosure. As shown in FIG. 11, an ashing treatment with oxidizing plasma may be performed to the first type of photoresist 301 corresponding to the channel region 2013. Because the oxidizing plasma reacts with and remove the photoresist 30, the ashing treatment with the oxidizing plasma may be performed to the first type of photoresist 301 to remove the first type of photoresist 301 and to expose the metal contact layer 202 corresponding to the channel region 2013. In one embodiment, the oxidizing plasma may include at least one of $O_2$, $O_3$, and $N_2O$.

In one embodiment, the ashing treatment with the oxidizing plasma may be performed to the first type of photoresist 301 corresponding to the channel region 2013. Particularly, the conditions of the ashing treatment may include a processing power of approximately 10 W-10000 W, a processing pressure of approximately 1 Pa-100000 Pa, a processing time of approximately 1 s-1000 s, and a processing temperature of approximately 1° C.-500° C.

Step S260: oxidizing the metal contact layer corresponding to the channel region by using an oxidizing plasma to obtain a barrier layer, and removing the photoresist corresponding to the source region and the drain region to obtain a metal contact layer corresponding to the source region and a metal contact layer corresponding to the drain region.

Figure 12:
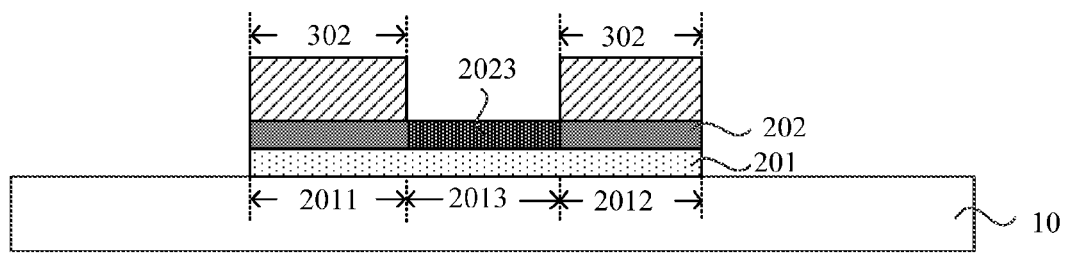
FIG. 12 illustrates a cross-sectional view of forming an exemplary barrier layer according to the disclosed embodiments.

FIG. 12 illustrates a cross-sectional view of forming an exemplary barrier layer according to the present disclosure. As shown in FIG. 12, an oxidation process with the oxidizing plasma may be applied to the metal contact layer 202 corresponding to the channel region 2013. The oxidizing plasma may oxidize the metal contact layer 202 in contact. In one embodiment, the treatment condition may include a processing power of approximately 10 W-10000 W, a processing pressure of approximately 1 Pa-100000 Pa, a processing time of approximately 1 s-1000 s, a processing temperature of approximately 1° C.-500° C.

In another embodiment, because metal contact layer 202 is made of at least one of titanium, molybdenum, aluminum, and silver, and the oxidizing plasma includes at least one of $O_2$, $O_3$, and $N_2O$, the barrier layer 2023 may be made of at least one of titanium, molybdenum, aluminum, and silver oxides or nitrides. The oxidation treatment with the oxidizing plasma may be applied to the metal contact layer 202 corresponding to the channel region 2013 to obtain the barrier layer 2023. A separate process for forming the barrier layer may be eliminated. By combining the metal contact layer and the barrier layer together, the structure and the fabrication process of the thin-film-transistors may be simplified.

Figure 13:
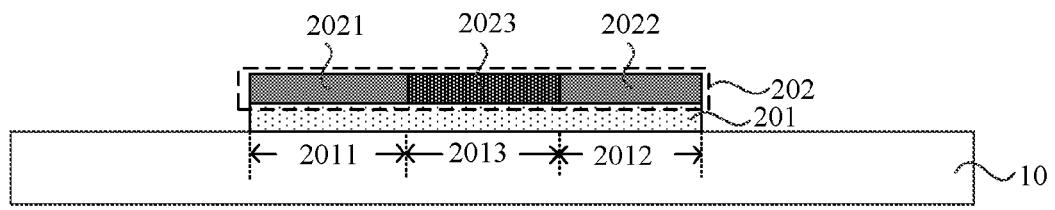
FIG. 13 illustrates a cross-sectional view of forming an exemplary source electrode metal contact layer and an exemplary drain electrode metal contact layer after the removal of the photoresist according to the disclosed embodiments.

FIG. 13 illustrates a cross-sectional view of forming an exemplary source electrode metal contact layer and an exemplary drain electrode metal contact layer after the removal of the photoresist according to the present disclosure. As shown in FIG. 13, the remaining second type of photoresist 302 may be removed to obtain the metal contact layer 202 that is not oxidized. The metal contact layer 202 in a position corresponding to the source region 2011 in the active layer 201 may be the source electrode metal contact layer 2021. The metal contact layer 202 in a position corresponding to the drain region 2012 in the active layer 201 may be the drain electrode metal contact layer 2022.

Step S270: forming a source electrode on a side of the source electrode metal contact layer facing away from the active layer, forming a drain electrode on a side of the drain electrode metal contact layer facing away from the active layer, and forming a gate electrode on a side of the barrier layer facing away from the active layer, where the gate electrode is insulated from the barrier layer.

Referring to FIGS. 7a-7e, by forming a gate electrode insulation layer 204 on a side of the barrier layer 2023 facing away from the active layer 201, and forming a gate electrode 2033 on a side of the gate electrode insulation layer 204, the gate electrode 2033 may be insulated from the barrier layer 2023. An interlayer insulation layer 205 may be formed on the substrate 10, the source electrode metal contact layer 2021, the gate electrode 2033, and the drain electrode metal contact layer 2023. A first opening 2061 and a second opening 2062 may be formed on the interlayer insulation layer 205. A source electrode 2031 may be electrically connected to the source electrode metal contact layer 2021 through the first opening 2061. A drain electrode 2032 may be electrically connected to the drain electrode metal contact layer 2022 through the second opening 2062.

In one embodiment, the active layer 201, the source electrode metal contact layer 2021, the drain electrode metal contact layer 2022, the barrier layer 2023, the source electrode 2031, the drain electrode 2032, the gate electrode 2033, the gate electrode insulation layer 204, and the interlayer insulation layer 205 may form a thin-film-transistor 20.

Further, the fabrication method according to the present disclosure includes forming a metal contact layer on a side of the active layer facing away from the substrate, forming a photoresist on the metal contact layer, applying an ashing treatment with the oxidizing plasma to remove the photoresist in a position corresponding to the channel region, oxidizing the metal contact layer by the oxidizing plasma in the position corresponding to the channel region to obtain a barrier layer, and removing the remaining photoresist to obtain a source electrode metal contact layer and a drain electrode metal contact layer. As a result, the fabrication method for the source electrode metal contact layer, the drain electrode metal contact layer, and the barrier layer is simplified, eliminates certain masking process, and ensures a high efficiency in the fabrication of thin-film-transistors. In addition, treating the metal contact layer in contact with the oxidizing plasma to obtain a barrier layer minimizes the damage to the active layer due to etching, ensures the stability of the thin-film-transistors, and hence ensures the stability of the entire array substrate.

In one embodiment, the process of exposing photoresist by using a mask may include the following steps.

A double-slit exposure process may be used to expose the photoresist 30 to ensure that the photoresist 30 corresponding to the channel region 2013 is partially exposed while the photoresist 30 corresponding to the source region 2011 and the drain region 2012 are not exposed. As a result, the photoresist 30 corresponding to the channel region 2013 may have a thickness thinner than the photoresist 30 corresponding to the source region 2011 and the drain region 2012. The photoresist 30 subject to the double-slit exposure process may have different thickness in different regions. Subsequently, a plasma sputtering process may be used to etch the metal contact layer 202 corresponding to the channel region 2013 to form a barrier layer 203.

In another embodiment, after the metal contact layer 202 is formed on the side of the active layer 201 facing away from the substrate 10, the process may further include the following steps.

The same masking process may be used to etch the active layer 201 and the metal contact layer 202 (not shown in the figure). Thus, additional masking process may be saved, and the fabrication process for the array substrate may be simplified.

In another embodiment, after the thin-film-transistor 20 is formed, the process may further include the following steps.

The thin-film-transistor 20 may be subject to high temperature annealing process to ensure the stable performance of the thin-film-transistor 20.

Figure 14:
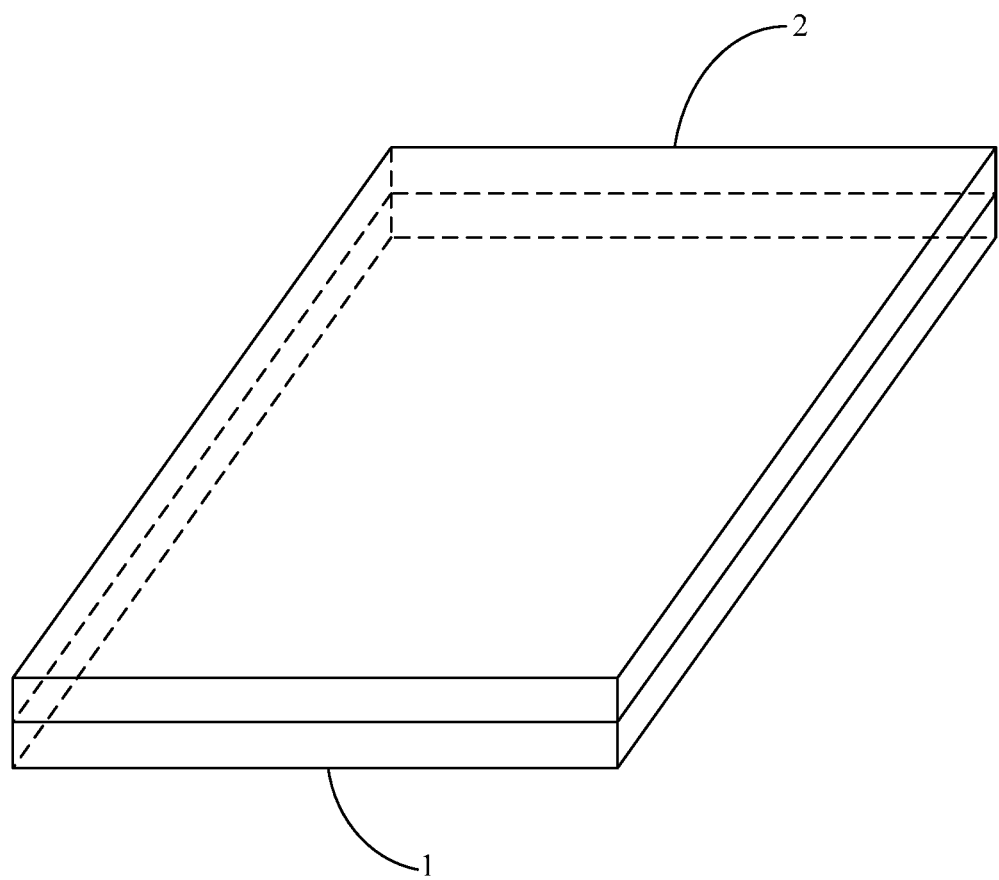
FIG. 14 illustrates a schematic view of an exemplary display panel according to the disclosed embodiments.

FIG. 14 illustrates a schematic view of an exemplary display panel according to the present disclosure. As shown in FIG. 14, the display panel may include an array substrate 1 according to the present disclosure, and an opposing substrate 2 facing toward the array substrate 1. The opposing substrate 2 may be a color film substrate, a cover, or other encapsulation layer.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. An array substrate, comprising:
a substrate; and
at least one thin-film-transistor, wherein, the thin-film-transistor includes:
   an active layer formed on the substrate, including a source region, a drain region, and a channel region located between the source region and the drain region;
   a source electrode metal contact layer, a drain electrode metal contact layer, and a barrier layer formed on a side of the active layer facing away from the substrate, wherein:
      the source electrode metal contact layer, the drain electrode metal contact layer, and the barrier layer are different regions of a same layer;
      the source electrode metal contact layer has an orthogonal projection on the active layer overlapping with the source region;
      the drain electrode metal contact layer has an orthogonal projection on the active layer overlapping with the drain electrode; and
      the barrier layer is located between the source electrode metal contact layer and the drain electrode metal contact layer, and has an orthogonal projection on the active layer overlapping with the channel region; and
   a source electrode formed on a side of the source electrode metal contact layer facing away from active layer, a drain electrode formed on a side of the drain electrode metal contact layer facing away from the active layer, and a gate electrode insulated from the barrier layer and formed on a side of the barrier layer facing away from the active layer, wherein:
      the source electrode is electrically connected to the source region in the active layer through the source electrode metal contact layer; and
      the drain electrode is electrically connected to the drain region in the active layer through the drain electrode metal contact layer.

2. The array substrate according to claim 1, wherein:
the active layer is made of an oxide semiconducting material.

3. The array substrate according to claim 1, wherein:
the barrier layer is made of an insulating metal oxide or metal nitride material.

4. The array substrate according to claim 1, wherein:
the source electrode metal contact layer and the drain electrode metal contact layer are made of at least one of titanium, molybdenum, aluminum, and silver.

5. The array substrate according to claim 1, wherein:
the source electrode metal contact layer and the drain electrode metal contact layer have a thickness of approximately 2 nm-50 nm.

6. The array substrate according to claim 1, wherein:
the barrier layer is made of at least one of titanium, molybdenum, aluminum, and silver oxides or nitrides.

7. The array substrate according to claim 1, wherein:
the barrier layer has a thickness of approximately 2 nm-50 nm.

8. The array substrate according to claim 1, wherein:
the gate electrode has an orthogonal projection on a plane, where the source electrode metal contact layer and the drain electrode metal contact layer are located, overlapping with the source electrode metal contact layer and the drain electrode metal contact layer.

9. A fabrication method for the array substrate, comprising:
providing a substrate; and
forming at least one thin-film-transistor on the substrate, wherein forming the at least one thin-film-transistor on the substrate includes:
forming an active layer on the substrate, including a source region, a drain region, and a channel region located between the source region and the drain region;
forming a source electrode metal contact layer, a drain electrode metal contact layer, and a barrier layer on a side of the active layer facing away from the substrate, wherein:
the source electrode metal contact layer, the drain electrode contact layer, and the barrier layer are coplanar with each other;
the source electrode metal contact layer has an orthogonal projection on the active layer overlapping with the source region;
the drain electrode metal contact layer has an orthogonal projection on the active layer overlapping with the drain electrode; and
the barrier layer is located between the source electrode metal contact layer and the drain electrode metal contact layer, and has an orthogonal projection on the active layer overlapping with the channel region; and
forming a source electrode on a side of the source electrode metal contact layer facing away from the active layer, forming a drain electrode on a side of the drain electrode metal contact layer facing away from the active layer, and forming a gate electrode on a side of the barrier layer facing away from the active layer, wherein:
the source electrode is electrically connected to the source region in the active layer through the source electrode metal contact layer; and
the drain electrode is electrically connected to the drain region in the active layer through the drain electrode metal contact layer.

10. The fabrication method for the array substrate according to claim 9, wherein forming a source electrode metal contact layer, a drain electrode metal contact layer, and a barrier layer on a side of the active layer facing away from the substrate includes:
forming a metal contact layer on a side of the active layer facing away from the substrate;
applying a photoresist on a side of the metal contact layer facing away from the active layer, and exposing the photoresist by using a mask such that the photoresist corresponding to the channel region has a thickness thinner than the photoresist corresponding to the source region and the drain region;
performing an ashing treatment with oxidizing plasma to the photoresist corresponding to the channel region and removing the photoresist corresponding to the channel region to expose the metal contact layer corresponding to the channel region; and
oxidizing the metal contact layer corresponding to the channel region by using an oxidizing plasma to obtain a barrier layer, and removing the photoresist corresponding to the source region and the drain region to obtain a metal contact layer corresponding to the source region and a metal contact layer corresponding to the drain region.

11. The fabrication method for the array substrate according to claim 10, wherein exposing photoresist by using a mask includes:
using a double-slit exposure process to expose the photoresist to ensure that the photoresist corresponding to the channel region is partially exposed while the photoresist corresponding to the source region and the drain region are not exposed.

12. The fabrication method for the array substrate according to claim 10, after the metal contact layer is formed on the side of the active layer facing away from the substrate, further including:
using the same masking process to etch the active layer and the metal contact layer.

13. The fabrication method for the array substrate according to claim 10, after the thin-film-transistor is formed, further including:
performing a high temperature annealing process to the thin-film-transistor.

14. The fabrication method for the array substrate according to claim 10, wherein:
the metal contact layer is made of at least one of titanium, molybdenum, aluminum, and silver; and
the metal contact layer has a thickness of approximately 2 nm-50 nm.

15. The fabrication method for the array substrate according to claim 10, wherein:
the oxidation treatment is a physical vapor deposition process; and
the physical vapor deposition process has a sputtering power of approximately 5 KW-15 KW, a pressure of approximately 0.1 Pa-5 Pa, an argon gas flow rate of approximately 50 sccm-200 sccm, and a sputtering time of approximately 5 s-100 s.

16. The fabrication method for the array substrate according to claim 10, wherein:
the oxidizing plasma includes at least one of $O_2$, $O_3$, and $N_2O$; and
the oxidation treatment condition includes a processing power of approximately 10 W-10000 W, a processing pressure of approximately 1 Pa-100000 Pa, a processing time of approximately 1 s-1000 s, a processing temperature of approximately 1° C.-500° C.

17. A display panel, comprising an array substrate, wherein the array substrate includes:
a substrate; and
a plurality of thin-film-transistors, wherein, the thin-film-transistor includes:
an active layer formed on the substrate, including a source region, a drain region, and a channel region located between the source region and the drain region;
a source electrode metal contact layer, a drain electrode metal contact layer, and a barrier layer formed on a side of the active layer facing away from the substrate, wherein:
the source electrode metal contact layer, the drain electrode metal contact layer, and the barrier layer are different regions of a same layer;
the source electrode metal contact layer has an orthogonal projection on the active layer overlapping with the source region;

the drain electrode metal contact layer has an orthogonal projection on the active layer overlapping with the drain electrode; and the barrier layer is located between the source electrode metal contact layer and the drain electrode metal contact layer, and has an orthogonal projection on the active layer overlapping with the channel region; and a source electrode formed on a side of the source electrode metal contact layer facing away from active layer, a drain electrode formed on a side of the drain electrode metal contact layer facing away from the active layer, and a gate electrode insulated from the barrier layer and formed on a side of the barrier layer facing away from the active layer, wherein:

the source electrode is electrically connected to the source region in the active layer through the source electrode metal contact layer; and the drain electrode is electrically connected to the drain region in the active layer through the drain electrode metal contact layer.

\* \* \* \* \*